United States Patent [19]

Tachibana et al.

[11] Patent Number: 6,072,354

[45] Date of Patent: *Jun. 6, 2000

[54] SEMICONDUCTOR DEVICE OUTPUT BUFFER CIRCUIT FOR LSI

[75] Inventors: Toshikazu Tachibana, Tachikawa; Takeshi Sakai, Kokubunji; Yoshinobu Nakagome, Hamura, all of Japan

[73] Assignees: Hitachi, Ltd., Tokyo; Hitachi Device Engineering Co., Ltd., Chiba-ken, both of Japan

[ * ] Notice: This patent issued on a continued prosecution application filed under 37 CFR 1.53(d), and is subject to the twenty year patent term provisions of 35 U.S.C. 154(a)(2).

[21] Appl. No.: 08/939,334

[22] Filed: Sep. 29, 1997

[30] Foreign Application Priority Data

Sep. 30, 1996 [JP] Japan .................................. 8-258277

[51] Int. Cl.[7] .................................................. H03K 17/16
[52] U.S. Cl. ............................ 327/390; 327/589; 326/88; 307/35; 307/110; 365/189.09; 365/226
[58] Field of Search .................................... 327/390, 389, 327/108, 427, 436, 589, 530, 536, 537; 326/88, 83, 56–58, 82, 85, 92; 307/35, 110; 365/226, 189.09, 189.06

[56] References Cited

U.S. PATENT DOCUMENTS

| 4,583,203 | 4/1986 | Monk ................................. 365/189.01 |
| 5,563,080 | 10/1996 | Ahn ......................................... 438/283 |
| 5,594,380 | 1/1997 | Nam ......................................... 327/390 |
| 5,621,342 | 4/1997 | Wong et al. ............................. 327/108 |

FOREIGN PATENT DOCUMENTS 6-204756   7/1994   Japan .

Primary Examiner—Timothy P. Callahan
Assistant Examiner—Minh Nguyen
Attorney, Agent, or Firm—Beall Law Offices

[57] ABSTRACT

In a semiconductor device having a plurality of output circuits such as a semiconductor memory device, a drive signal having a boosted voltage level which is produced from a boosting circuit is applied to a gate of a low-level outputting MOS transistor in the output circuit. As a result, even when a potential at the ground wiring line is floated, a substantial decrease of a potential difference between the ground wiring line and the gate of the low-level outputting MOS transistor can be prevented. Also, a signal having a sufficiently high level can be supplied to a gate of a low-level outputting output MOS transistor. As a consequence, delays in the switching operation of the output MOS transistor can be suppressed, and the output circuit can be operated at high speed.

9 Claims, 13 Drawing Sheets

SEMICONDUCTOR DEVICE OUTPUT BUFFER CIRCUIT FOR LSI

BACKGROUND OF THE INVENTION

The present invention generally relates to an improvement of increasing an operating speed of an output circuit employed in a semiconductor integrated circuit such as an output circuit employed in a semiconductor memory device. More specifically, the present invention is directed to an output circuit of a large-capacity dynamic random access memory (DRAM) having a multi-bit output terminal.

FIG. 6 represents a circuit diagram of an output circuit which has been conceived by the Inventors prior to an output circuit invented by these Inventors.

FIG. 7 is a circuit diagram of a boosting circuit indicated as a blank box. FIG. 8 represents an operation waveform diagram of the output circuit shown in FIG. 6. It should be noted that detailed circuit indications are omitted from the respective drawings, which have no direct relationship with the present invention, for the sake of simple explanation.

In the output circuit, symbol "VCCO (for instance, 5 V or 3.3 V)" indicates a power supply voltage externally applied, and symbol "VCC" shows another power supply voltage (for example, 3.3 V) applied from a voltage limiting circuit 1 (BST1) inside or outside a chip, and symbols "VSS" and "VSSO" represent ground power supply potentials (for instance, 0 V) externally applied. Although there is no restriction in implication, "VCC" and "VSS" may be regarded as one power supply potential and the other power supply potential, which constitute one pair of power supply potentials outputted from a single power supply. Similarly, "VCCO" and "VSSO" may be regarded as one power supply potential and the other power supply potential, which constitute one pair of power supply potentials outputted from a single power supply. Also, these potentials VCC, VSS, VCCO and VSSO may be called as first, second, third, and fourth power supply potentials. It should be understood that there is one case where VSS and VSSO are commonly, mutually connected to each other, and there is another case where VSS is separated from VSSO.

Symbol "DOE" shows an output control signal from the output circuit; symbols "DOT" and "DOB" denote input data entered into the output circuit so as to produce data which should be outputted from this output circuit; and symbol "IO" indicates an output terminal. Also, symbols "NAND1" and "NAND2" represent NAND gate circuits; symbol "INV1" shows an inverter circuit; symbols "NMOS1" and "NMOS2" denote n-channel type MOS transistors (will be referred to as "nMOS" hereinafter); and symbols "N1", "N2", "N3" and "N4" show internal nodes.

When the node N1 becomes a low level, namely VSS, the boosting circuit 1 (BST1) boosts the signal level of the node N3 higher than, or equal to VCC, so that the high level of the signal outputted from NMOS1 to the output terminal IO is increased higher than, or equal to a predetermined high level (VOH). In the case that the node N1 becomes a high level, namely VCC, a low level of the ground power supply potential VSS level is outputted to the node N3. This boosting circuit 1 (BST1) is also called a charge pump circuit, and may be realized as the circuit shown in FIG. 7.

In FIG. 7, symbol "IN" shows an input terminal; symbol "OUT" denotes an output terminal; symbols "VCC" and "VSS" represent a power supply terminal and a ground power supply terminal; symbol "INVB1" is an inverter circuit; symbols "NMOSB1" and "NMOSB2" are nMOS; symbol "PMOSB1" indicates a p-channel type MOS transistor (will be referred to as a "pMOS" hereinafter); symbol "C1" is a capacitor; and symbols "B1" and "B2" are internal nodes. It should also be noted that in FIG. 7, the p type MOS transistor is indicated by additionally using an arrow in order that this p type MOS transistor is discriminatable from the n type MOS transistor. In this boosting circuit of FIG. 7, when the level of the input IN is changed from a high level to a low level, the potential of the node B1 is changed from VSS to VCC, so that the potential at the node B2 is increased up to a level higher than VCC, and this node B2 is precharged to approximately the VCC level by the transistors NMOSB2 and NMOSB3 by coupling C1. In response thereto the output OUT becomes higher than, or equal to VCC. Conversely, when the input IN is changed from a low level to a high level, the transistor NMOSB1 is turned ON, and the output OUT becomes the VSS level.

When the output data should become a low level in the output circuit of FIG. 6, namely DOT=a low level and DOB=a high level, the output circuit is operated in such a manner that signals as indicated in FIG. 8 are produced. In other words, in the case that Levels of the input data DOT and DOB are determined, and the control signal DOE is changed from the VSS level to the VCC level, the level of the internal node N2 becomes the VSS level, and also the level of the node N4 becomes the VCC level by the inverter INV1. As a result, the transistor NMOS2 is turned ON and the output IO is lowered to the VSSO level. The low level of the output data of the output IO is outputted by the transistor nMCS, namely NMOS2. In response to this fact, no one conceives that there is no problem if the gate voltage of NMOS2 is equal to VCC, the low level output is produced.

Conversely, when the output data becomes a high level, namely DOT=a high level and DOB=a low level, the output circuit is operated in such a way that signals varied as indicated by dotted lines of FIG. 8 are produced. In other words, when the levels of the input data DOT and DOB are determined, and further the level of the control signal DOE becomes the VCC level, the potential level of the internal node "N1" becomes the VSS level in response to the above-described level changes, and also the potential level of another node "N3" is increased to such a high level higher than, or equal to the VCC level by the boosting circuit 1. As a consequence, even when the output transistor connected between the power supply terminal VCCO and the output IO is an nMOS (NMOS1), the output data having the level higher than, or equal to a VCC-VTH (note: VTH being threshold voltage of nMOS) can be outputted to the output IO.

In the above-described example, when the data is outputted outside the semiconductor chip, the ground potential is floated at the far portion of the VSS wiring line (pattern) formed on the chip, namely at the VSS wiring line portion located far from the bonding pad for the VSS wiring line formed on the chip. As a result, the effective power supply voltage level is lowered, so that the operating speed of the output circuit on the side of far portion is delayed. This ground level floating phenomenon is caused by the load on the output side (stray capacitance of board), and also the parasitic resistance of the VSS wiring line (ground wiring line) within the chip. Now, the above-described problem belonging to FIG. 6 will be described.

FIG. 9 schematically indicates an output circuit arrangement of a large capacity dynamic random access memory (DRAM) having a multi-bit output (e.g., 16-bit parallel output (×16)) structure. FIG. 10 shows a waveform diagram of this DRAM. Symbols VSSO(P), IO(N) and IO(F) show bonding pads which are electrically connected to the external circuit of the chip, and are provided on this chip. It should be noted that the bonding pad VCCO is omitted from FIG. 9.

Symbol "VSSO(N)" indicates a wiring line portion among the VSSO wiring line connected to the bonding pad VSSO(P) and located near this VSSO(P) pad (namely, near portion), whereas symbol "VSSO(F)" indicates another wiring line portion among the VSSO wiring line connected to this bonding pad VSSO(P) and located far from this VSSO (P) pad (namely, far portion). Symbol "Rpar" is a parasitic resistance of the VSSO wiring line, and corresponds to such a parasitic resistance between VSSO(N) and VSS(F). As schematically indicated, each of the output circuits is arranged by NMOS1, NMOS2, and CNT. In this case, symbol "NMOS1" is a MOS transistor for outputting a high level, and symbol "NMOS2" is a MOS transistor for outputting a low level. Symbol "CNT" indicates a control circuit for controlling NMOS1 and NMOS2 by employing DOE, DOT, and DOB. Symbol "N4" shows a control signal for controlling NMOS2. Also, the internal circuits INTC1 and INTC2 are connected to DOE, DOT and DOB. Also, symbol "VTH" of FIG. 10 indicates a threshold voltage of NMOS2.

In the case of the 16-bit parallel output arrangement, 16 output circuits are connected via the VSSO wiring lines to the VSSO bonding pads VSSO(P). Thus, in the DRAM output circuit of FIG. 9, when a large number of output circuits output low levels, the VSSO potential is floated at the far portion VSSO(F) of the VSSO wiring line, as indicated in FIG. 10, which is caused by currents flowing through loads (not shown) connected to the respective pads IO. Since the transistor NMOS2 is not turned ON when the difference between the signal N4 and the VSSO potential is increased higher than, or equal to the threshold value VTH, the operating speed thereof is delayed in response to such a fact that the VSSO potential is floated (namely, potential is raised from 0 V). Therefore, the difference in the operation timing between the output circuit at the far portion and the output circuit at the near portion is increased. This may cause such a problem that the data output speed is lowered. On the other hand, in order to avoid the potential floating phenomenon by reducing the impedance of the VSSO wiring line, the wiring pattern having such a large area must be employed by which a relatively large current is allowable. However, this large-area wiring line may increase the entire area, which could impede low-cost designing for manufacturing high integration DRAMs.

SUMMARY OF THE INVENTION

The present invention can suppress lowering of operating speed caused by floating of the VSSO potential by such that in the above-described output circuit, the internal node N4 corresponding to the gate of the transistor NMOS2 for outputting the low level is increased to a level higher than, or equal to the power supply voltage VCC as indicated in FIG. 11. To increase level of the internal node N4, it is possible to supply a circuit having an arrangement basically identical to that of the boosting circuit for producing the gate signal of the transistor NMOS1, or basically different from this boosting circuit.

As described above, the present invention is featured by that since the transistor NMOS2 for outputting the low level is boosted by the boosting circuit, the adverse influence caused by the VSSO potential floating can be reduced, so that the operating speed of the output circuit can be increased.

A semiconductor device, according to an aspect of the present invention, is featured by such a semiconductor device comprising an internal circuit, and an output circuit for outputting output data of this internal circuit, in which a first power supply voltage is applied via a first power supply connection point and a second power supply connection point to the internal circuit; the output circuit is comprised of: first conductivity type of first and second MOS transistors series-connected between a third power supply connection point and a fourth power supply connection point; an output terminal connected to a common connection node between the first MOS transistor and the second MOS transistor; a first amplifier converting means for receiving from the internal circuit, a first signal having a voltage amplitude between a potential at the first power supply connection point and a potential at the second power supply connection point, and for converting the first signal into a second signal used to drive a gate of the first MOS transistor; and a second amplitude converting means for receiving the first signal from the internal circuit and for converting the first signal into a third signal used to drive a gate of the second MOS transistor; and in which a voltage amplitude of the second signal and a voltage of the third signal are larger than that of the first signal.

BRIEF DESCRIPTION OF THE DRAWINGS

A more complete understanding of the teachings of the present invention may be acquired by referring to the accompanying figures, in which like reference numbers indicate like features and wherein.

DESCRIPTION OF THE PREFERRED EMBODIMENTS

Referring now to drawings, various embodiments of the present invention will be described.

Figure 1:
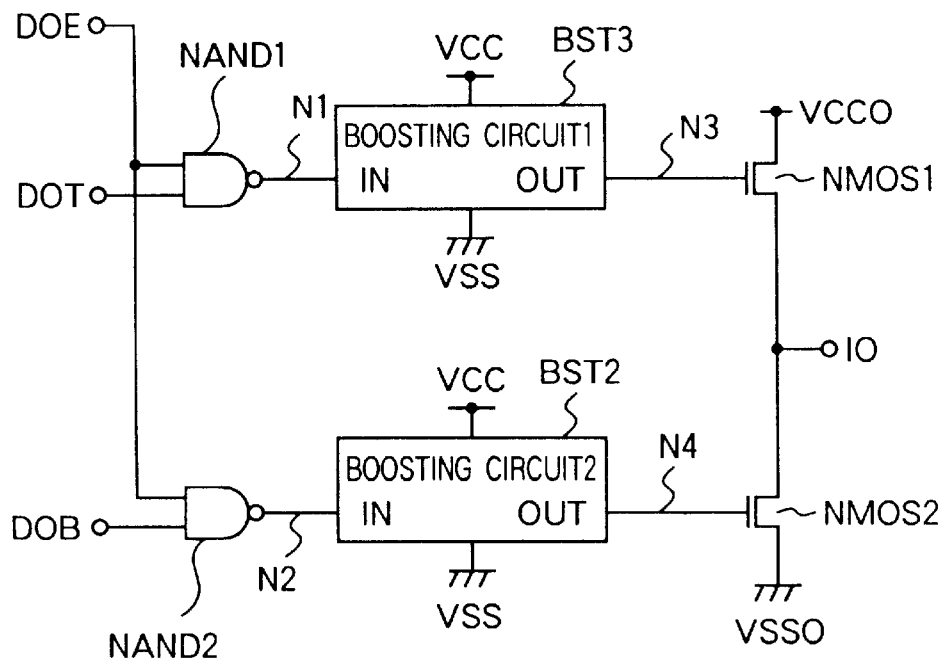
FIG. 1 shows a circuit diagram of an output circuit employed in a semiconductor integrated circuit, according to a first embodiment of the present invention.
Figure 2:
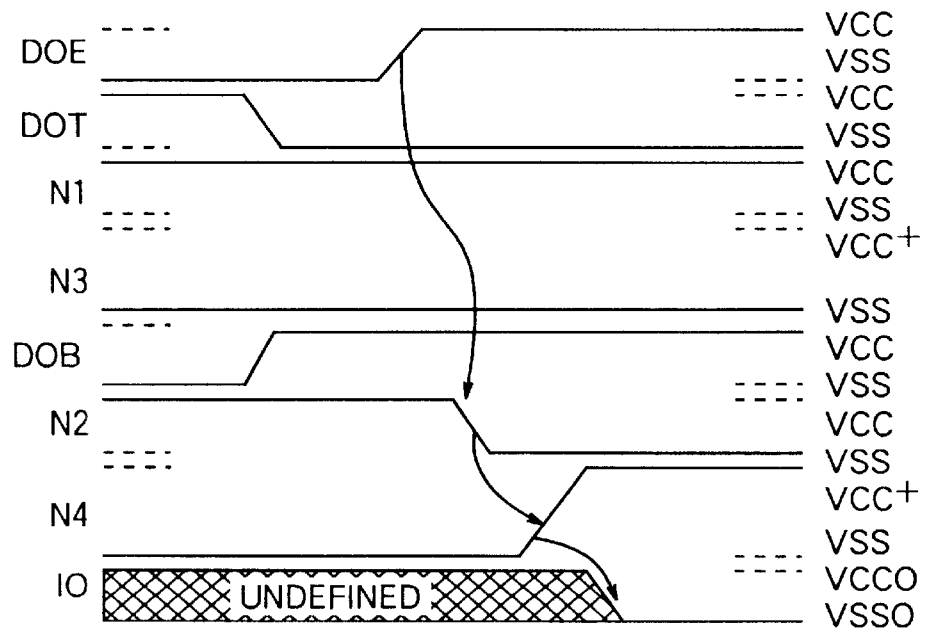
FIG. 2 represents a signal waveform diagram of various signals appearing in the output circuit of FIG. 1.
Figure 6:
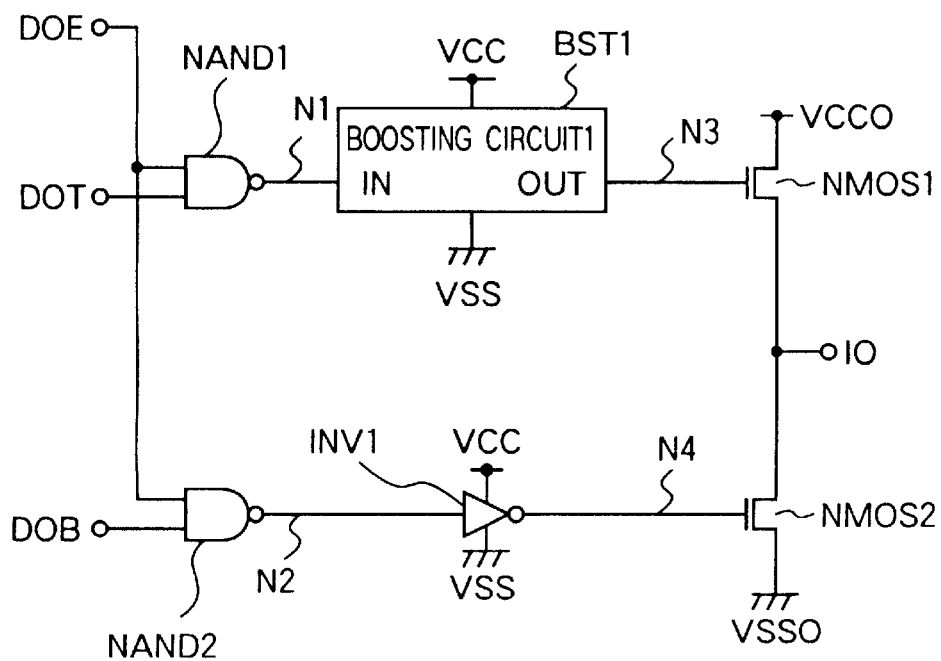
FIG. 6 is a circuit diagram of one output circuit conceivable prior to the output circuit of the present invention.

FIG. 1 shows a circuit diagram of an output circuit employed in a semiconductor integrated circuit (not shown in detail), according to a first embodiment of the present invention. FIG. 2 represents a control signal for this output circuit, and an operation waveform thereof. It should be noted that the same names shown in the above-described output circuit of FIG. 6 are employed as those for denoting the same circuit functions of FIG. 1.

Figure 7:
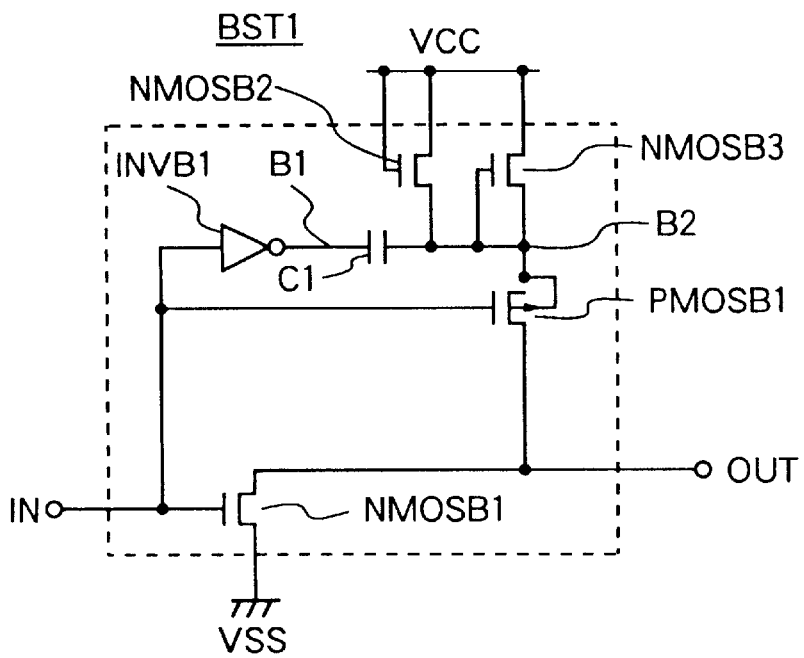
FIG. 7 is a circuit diagram of another boosting circuit.
Figure 8:
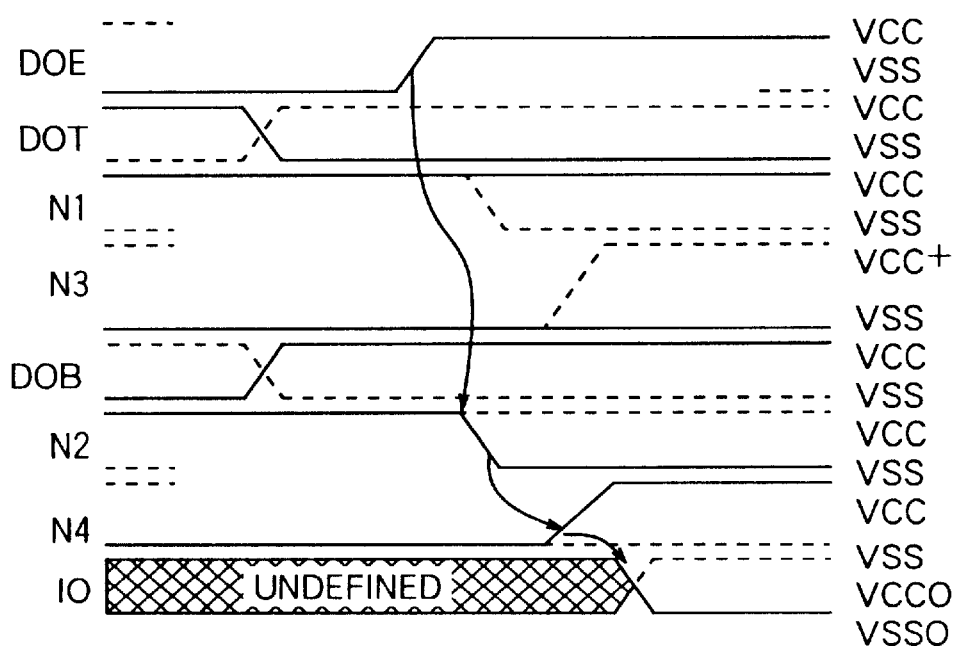
FIG. 8 shows a signal waveform diagram of various signals.

The circuit arrangement of this output circuit shown in FIG. 1 is featured by that a boosting circuit BST2 is also provided for a gate signal of an NMOS2 corresponding to a low-level outputting MOS transistor. As this boosting circuit BST2, for instance, such a boosting circuit as shown in FIG. 7 is used.

Now, operation of the output circuit will be explained. It should also be noted that since the circuit operation when the output data becomes a high level, namely DOT=a high level and DOB=a low level, is identical to that of the output circuit shown in FIG. 6, the explanation thereof is omitted.

When the output data becomes a low level, namely DOT=a low level and DOB=a high level, this output circuit is operated in such a manner that a level change as indicated by a solid line shown in FIG. 2 will occur. First, in the case that the levels of the input data DOT and DOB are defined as a low level and a high level respectively, and further a control signal DOE becomes a high-leveled output designation level, or a high-leveled output allowable level, an internal node "N2" becomes a low level in response thereto, and then a node "N4" becomes a high level higher than, or equal to VCC by way of a boosting circuit BST2. As a result, even when VSSO is floated, the operating speed of the output circuit can be hardly lowered. Also, a wiring line (pattern) having a relatively high impedance can be utilized as the wiring line (pattern) of this VSSO, and an area of a semiconductor chip can be reduced.

Figure 3:
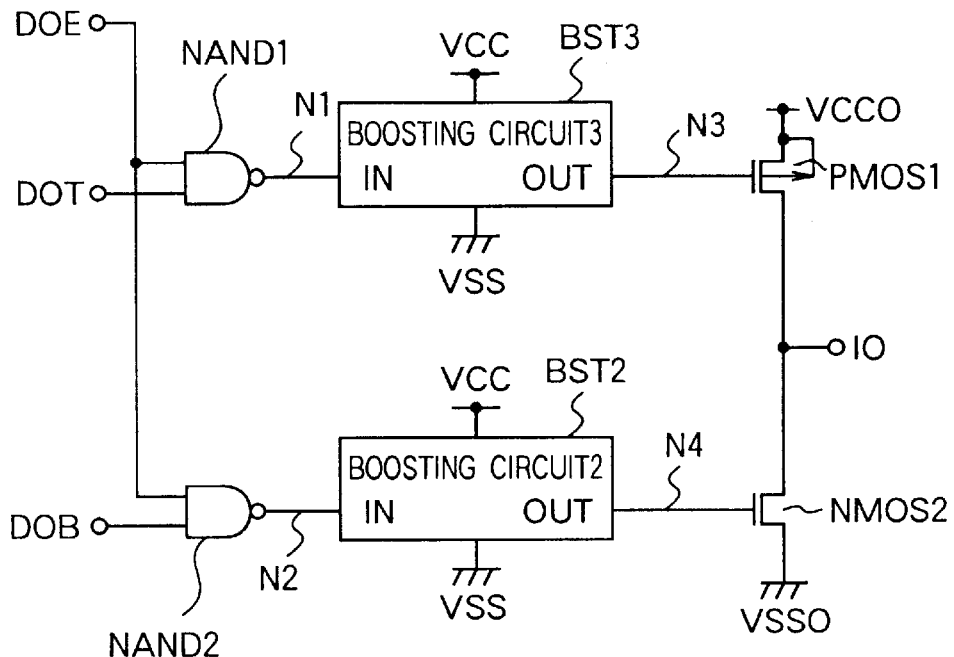
FIG. 3 indicates a circuit diagram of an output circuit employed in a semiconductor integrated circuit, according to a second embodiment of the present invention.
Figure 4:
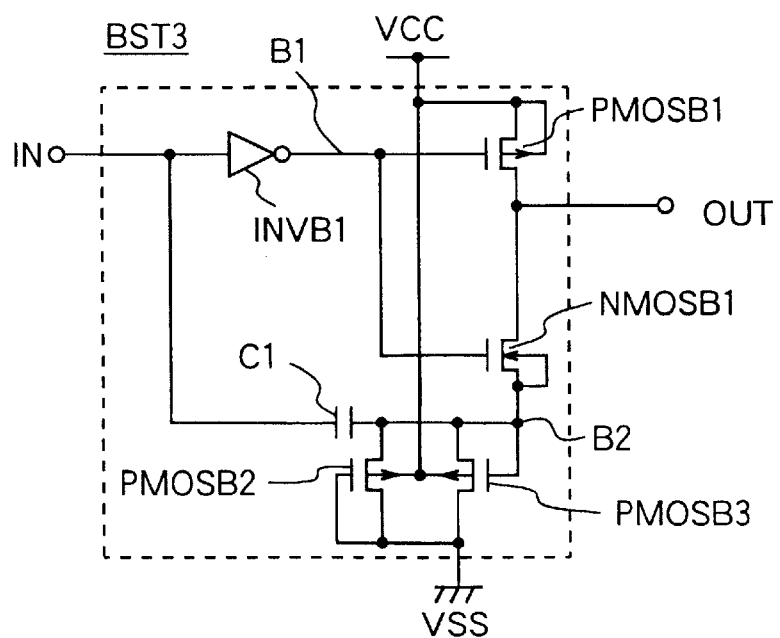
FIG. 4 is a concrete circuit diagram of a boosting circuit shown in FIG. 3.
Figure 5:
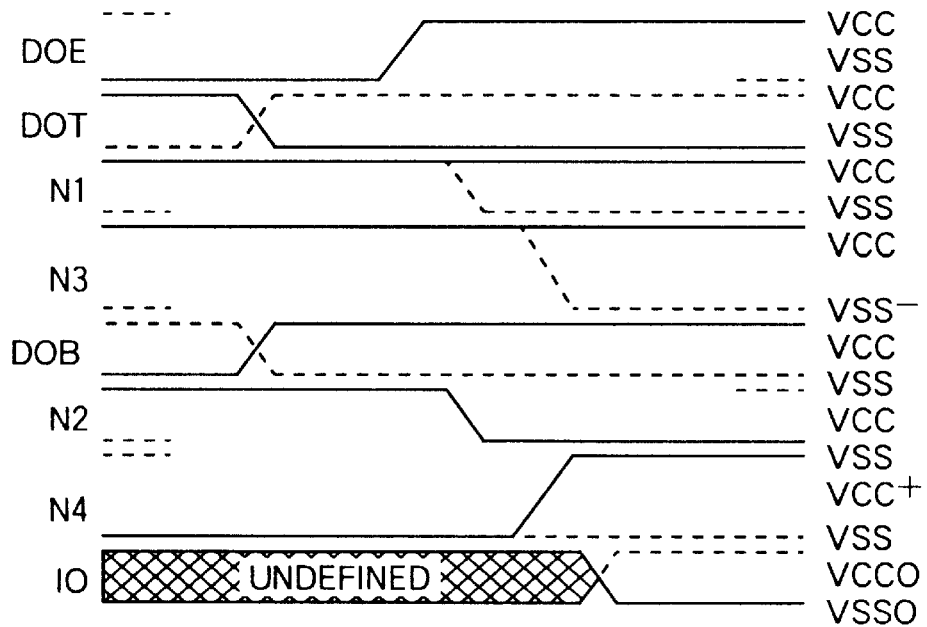
FIG. 5 represents a signal waveform diagram of various signals appearing in the boosting circuit of FIG. 3.

FIG. 3 indicates a circuit diagram of an output circuit employed in a semiconductor integrated circuit, according to a second embodiment of the present invention. FIG. 4 shows a concrete circuit arrangement of a boosting circuit BST3 of FIG. 3. FIG. 5 represents a control signal and an operation waveform of this boosting circuit. It should be understood that the same names indicated in the first embodiment of FIG. 1 will be employed as those for denoting the same functional elements in FIG. 3.

A feature of the output circuit arrangement shown in FIG. 3 is realized by that boosting circuits BST2 and BST3 which are not employed in the conventional CMOS (complementary MOS) type output circuit are newly employed for both a gate input signal of a high-level outputting MOS transistor as well as a gate input signal of a low-level outputting MOS transistor. In connection with the above structure, the high-level outputting nMOS (NMOS1) shown in FIG. 1 is changed into a pMOS (PMOS1) in the second embodiment of FIG. 3, and the boosting circuit 1 of FIG. 1 is changed into a boosting circuit 3 (BST3) in the second embodiment of FIG. 3. The boosting circuit 3 (BST3) is such a circuit for boosting a (potential) level of an internal node N3 to a negative direction level lower than, or equal to VSS when a (potential) level of another internal node N1 becomes a low level, namely VSS. This boosting circuit BST3 may be constituted by employing a circuit arrangement of FIG. 4. As a result, lowering of the circuit operating speed can be avoided which is caused by that not only VSSO is floated, but also VCCO is lowered.

When the output data becomes a low level, namely DOT=a low level and DOB=a high level, the output circuit of FIG. 3 is operated in such a manner that signals varied as represented by solid lines of FIG. 5 are formed.

In other words, when the levels of the input data DOT and DOB are determined as a low level and a high level, respectively, and further the level of the control signal DOE becomes a high level, a potential level of an internal node "N2" becomes a low level in response to the above-described level changes, and also a potential level of another node "N4" connected to the gate of the NMOS2 is increased to such a high level higher than, or equal to VCC level by the boosting circuit 2. As a consequence, even when VSS is floated, lowering of the circuit operating speed can be suppressed.

Conversely, when the output data becomes a high level, namely DOT=a high level and DOB=a low level, the output circuit of FIG. 3 is operated in such a way that signals varied as indicated by dotted lines of FIG. 5 are produced.

In other words, when the levels of the input data DOT and DOB are determined as a high level and a low level, respectively, and further the level of the control signal DOE becomes a high level, the potential level of an internal node "N1" becomes a low level in response to the above-described level changes, and also the potential level of another node "N3" connected to the gate of the PMOS1 is decreased to such a low level lower than, or equal to VSS level by the boosting circuit 3. As a consequence, even when a voltage drop occurs in VCCO, lowering of the circuit operating speed can be suppressed.

Figure 9:
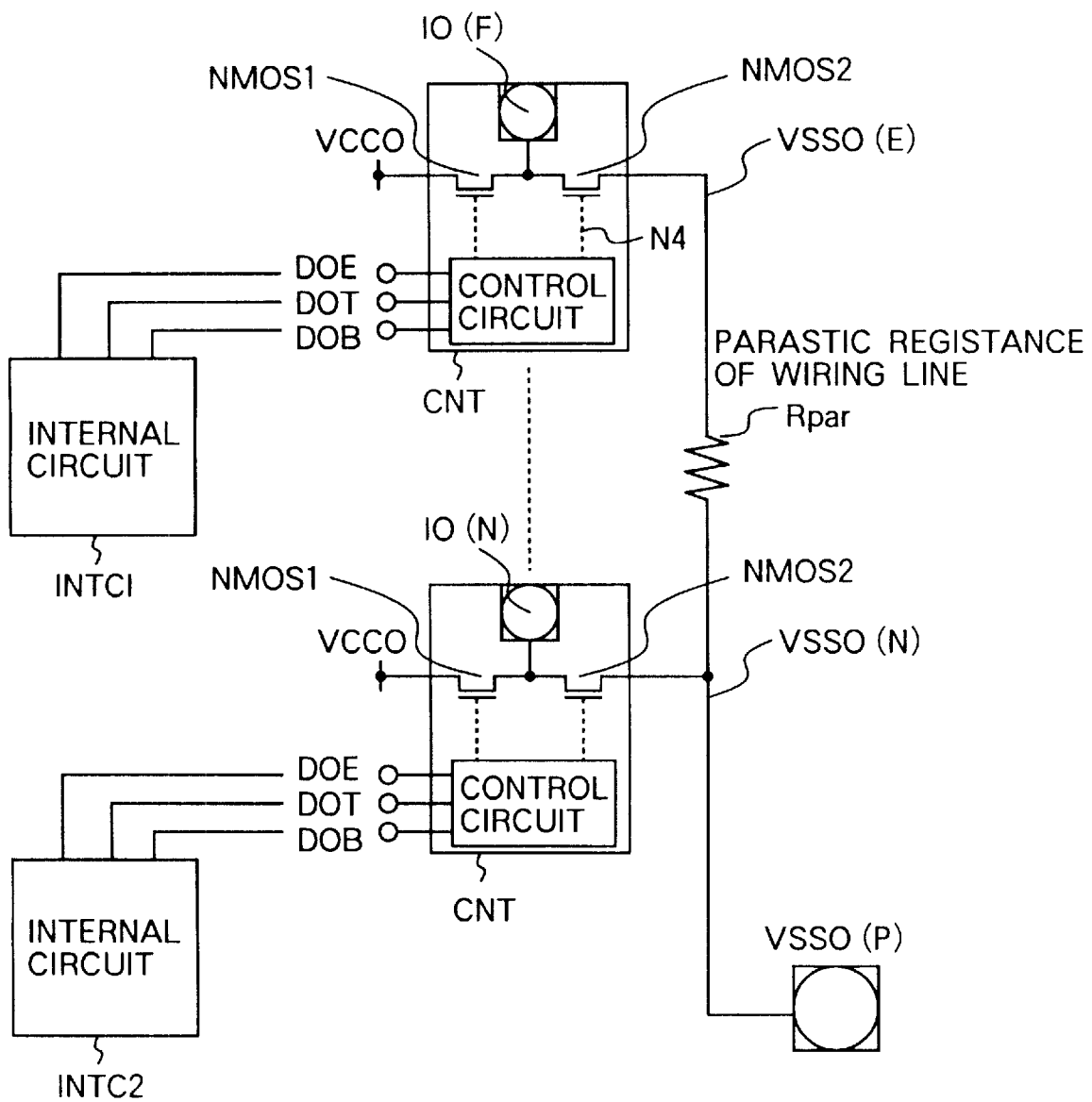
FIG. 9 indicates an output circuit arrangement diagram of a DRAM constructed of a multi-bit parallel output structure.
Figure 10:
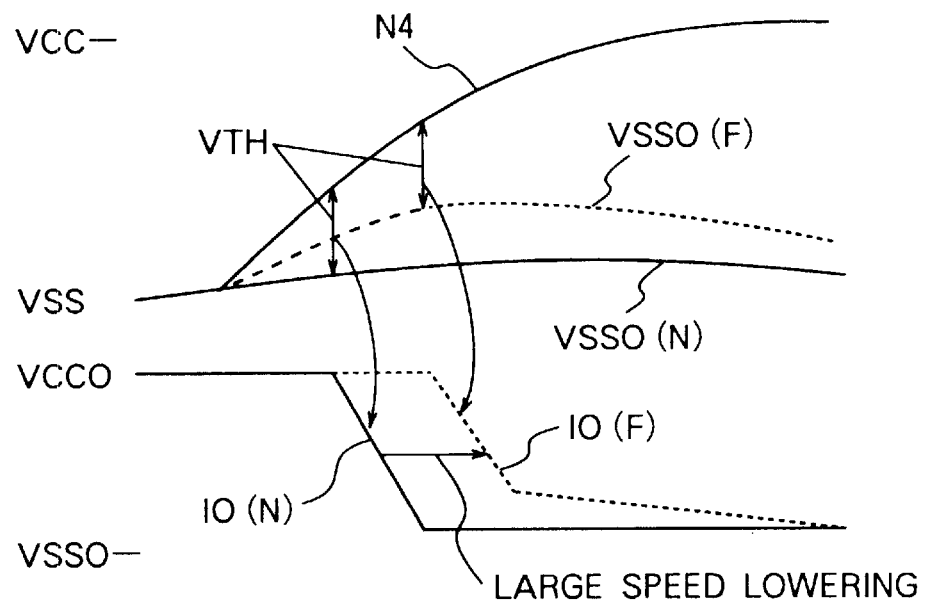
FIG. 10 represents a signal waveform diagram of various signals appearing in the output circuit of FIG. 6.
Figure 11:
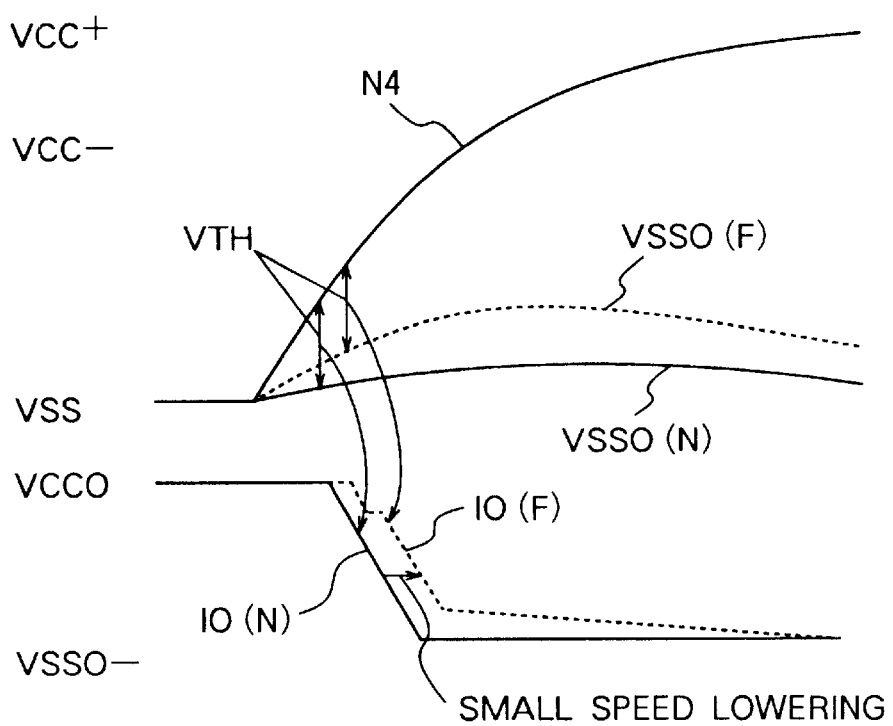
FIG. 11 shows an operation waveform diagram of the output circuit shown in FIG. 9.

FIG. 11 represents operation waveforms of an output circuit employed in a DRAM with a multi-bit arrangement, according to another embodiment of the resent invention, shown in FIG. 9. Comparing with the perations of the prior-conceivable output circuit shown in FIG. 6, even when the potential VSSO at the same far portion is floated in this output circuit of FIG. 11, lowering of the circuit operating speed can be suppressed.

Figure 12:
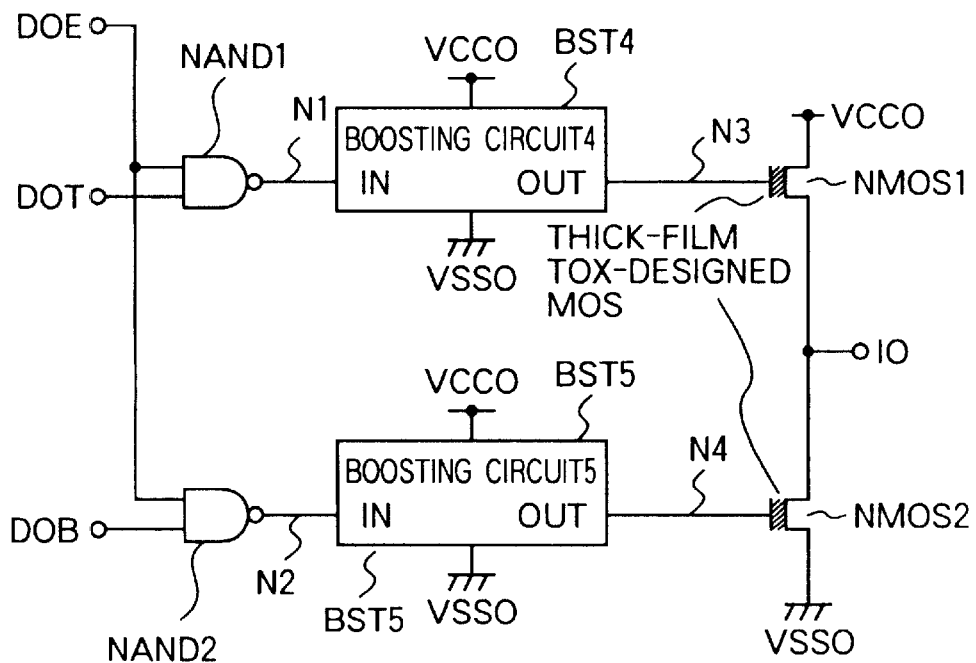
FIG. 12 shows a circuit diagram of an output circuit employed in a semiconductor integrated circuit, according to a third embodiment of the present invention.
Figure 13:
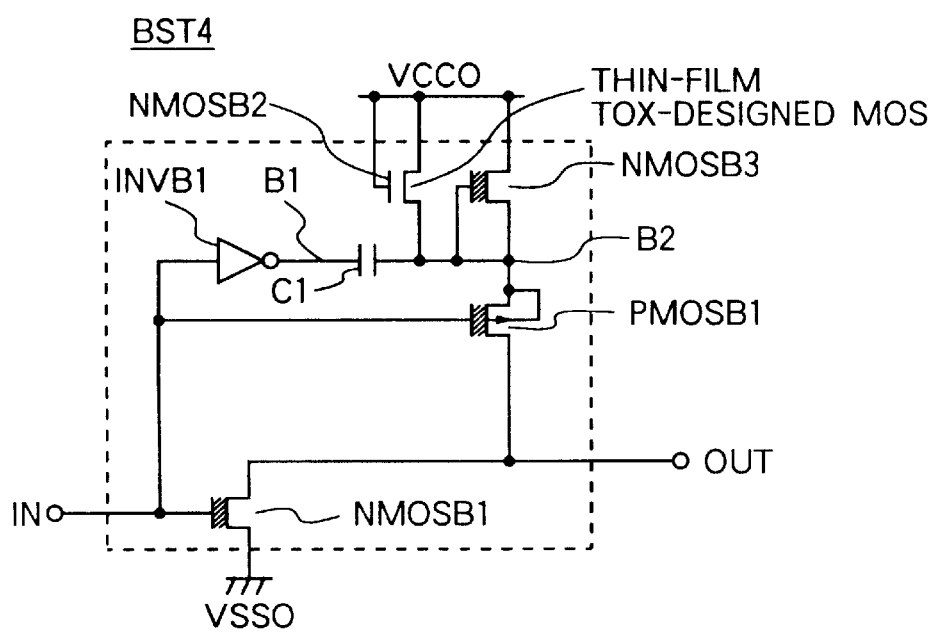
FIG. 13 is a circuit diagram for representing a concrete circuit of the boosting circuit BST4 employed in the output circuit of FIG. 12.
Figure 14:
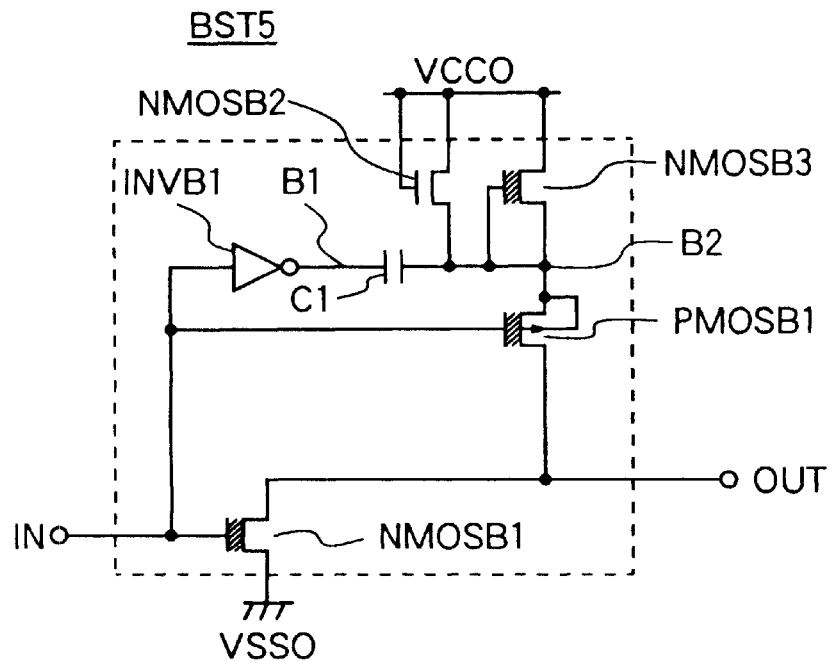
FIG. 14 is a circuit diagram for indicating a concrete circuit of the boosting circuit BST5 employed in the output circuit of FIG. 12.
Figure 15:
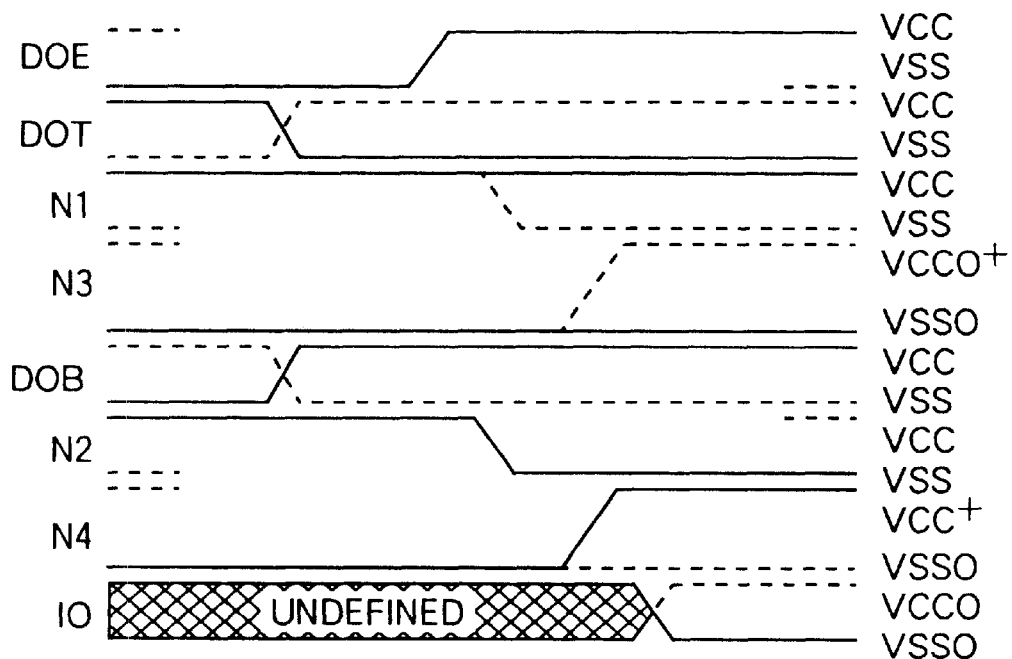
FIG. 15 indicates an operation waveform diagram of the output circuit shown in FIG. 12.

FIG. 12 shows a circuit arrangement of an output circuit according to a third embodiment of the present invention. FIG. 13 is a circuit diagram for representing a concrete circuit of a boosting circuit 4 (BST4) employed in the output circuit of FIG. 12. FIG. 14 is a circuit diagram for indicating a concrete circuit of another boosting circuit 5 (BST5) employed in the output circuit of FIG. 12. FIG. 15 shows an operation waveform diagram of the output circuit according to the third embodiment. It should also be noted that the same names of FIG. 6 will be employed as those for denoting the same functional elements shown in the circuit diagram of FIG. 12.

A structural feature of the output circuit of FIG. 12 according to the third embodiment is to employ a boosting circuit BST5, a high-level outputting nMOS NMOS1, a low-level outputting nMOS NMOS2, and a high voltage withstanding MOS transistor. This boosting circuit BST5 produces a signal which is supplied to the gate of the low-level outputting nMOS NMOS2. A high voltage higher than a voltage of an internal circuit (not shown in detail) is applied to the high-level outputting nMOS NMOS1. The high voltage withstanding MOS transistor is used as one of the MOS transistors employed in the boosting circuit.

In connection with this circuit feature, the boosting circuit 5 (BST1) shown in FIG. 7 is changed into such a boosting circuit 4 (BST4) as indicated in FIG. 13, and also another boosting circuit 5 (BST5) as indicated in FIG. 14 is added in the third embodiment of FIG. 12.

The boosting circuit 4 (BST4) is such a circuit for increasing the level of the node N3 to a high level higher than, or equal to the VCCO level where the level of the node N1 becomes a low level, namely the VSS level. In FIG. 13, there is shown an example of a concrete circuit of this boosting circuit BST4.

The boosting circuit 5 (BST5) is such a circuit for increasing the level of the node N4 to a high level higher than, or equal to the VCCO level when the level of the node N2 becomes a low level, namely the VSS level. In FIG. 14, there is shown an example of a concrete circuit of this boosting circuit BST5. As a consequence, lowering of the operating speed which is caused by floating the VSSO potential can be prevented.

Various sorts of input signals DOE, DOT, and DOB are supplied to the output circuit of FIG. 12 from an internal circuit (not shown) which is formed together with this output circuit on a single semiconductor chip manufactured by single crystal (monocrystal) silicon. This internal circuit and a voltage limiting circuit (not shown in detail) are formed on this semiconductor chip, if required. This voltage limiting circuit receives the voltage VCCO of the external power source having such a voltage value as 3.3 V, and outputs a limited voltage having a voltage value such as 2.2 V, 1.8 V, or 1.5 V. This limited voltage value is lower than the voltage value VCCO of the external power source. The output (limited voltage) of the voltage limiting circuit is applied as a power source voltage of the internal circuit to this internal circuit.

Although not being restricted to this structure, the semiconductor chip owns a complementary MOS transistor structure having an nMOS and a pMOS. Both the nMOS and the PMOS used to form the internal circuit (not shown) are manufactured so as to own a relatively small threshold voltage characteristic, respectively, in such a manner that a so-called "gate insulating film" formed between a gate electrode thereof and a channel forming region thereof owns a relatively thin thickness.

The power consumption of the above-described internal circuit is reduced in response to such a fact that the operating voltage of this internal circuit is lowered by the voltage limiting circuit. That is, in the above-explained internal circuit, the consumed currents are reduced in response to lowering of this operating voltage. The consumed currents are produced by the penetrating current flowing through the series-connection path of the nMOS and the pMOS during the signal transition, the stray capacitance existing in the various wiring lines (patterns) and also the various circuit elements within the internal circuit, and the load current flowing through the load such as parasitic capacitance. Also, the above-explained internal circuit can be sufficiently operated in high speeds even under relatively low operating voltage applied from the voltage limiting circuit, because the amplitude of the signal is reduced in connection with lowering of this operating voltage, and also the ON-resistance values of the nMOS and the pMOS are reduced due to such a fact that the threshold voltages of these nMOS and pMOS for constituting this internal circuit are made relatively low.

In this case, such an MOS transistor having a relatively thin gate insulating film, which will constitute the internal circuit (not shown), corresponds to a basic MOS transistor. That is, a large number of such basic MOS transistors are manufactured on the semiconductor chip by way of the semiconductor integrated circuit manufacturing technique by using the very fine processing precision, namely can be regarded as the standard MOS transistors. Since the standard MOS transistor owns the relatively thin thickness of the gate insulating film, the gate withstanding voltage of this standard MOS transistor becomes relatively low. As a result, this standard MOS transistor may ohm such a risk that the gate insulating film is electrically destroyed by the voltage having the relatively high level applied between the gate electrode and drain thereof, or the characteristic of the gate insulating film is deteriorated.

It should be understood that the NMOS1 and the NMOS2 employed in the output circuit of FIG. 12, the NMOSB1, NMOSB3, PMOSB1 employed in the boosting circuit BST4 shown in FIG. 13, and further the NMOSB1, NMOSB3, PMOSB1 employed in the boosting circuit BST5 shown in FIG. 14 are preferably selected from high voltage withstanding MOS transistors.

As the above-explained high voltage withstanding MOS transistor, a thick film TOX-designed MOS transistor may be employed whose gate insulating film TOX owns a relatively thick thickness, as compared with a relatively thin thickness of a so-called "standard MOS transistor" which constitutes, for instance, an internal circuit (not shown).

It should also be noted that the MOS transistor to which the VCCO level is directly applied such as an MOS transistor (not shown) for constituting the voltage limiting circuit may also be arranged by a high voltage withstanding type MOS transistor.

Next, a description will now be made of operations of this output circuit shown in FIG. 12 according to the third embodiment.

When the output data should become a low level, namely DOT=a low level and DOB=a high level, the output circuit of FIG. 12 is operated in such a manner that signals varied as indicated by solid lines of FIG. 15 are produced.

In other words, in the case that the input data DOT and DOB to be outputted are determined as a low level and a high level, respectively, and the control signal DOE becomes a high level, the potential level of the internal node N2 becomes a low level in response to the above level changes. Also, the potential level of the node N4 to which the gate of the NMOS2 is coupled is increased at a level higher than, or equal to the VCCO level by the boosting circuit 5 (BST5). As a consequence, even when the VSSO level is floated, lowering of the operating speed of this output circuit can be suppressed.

When the output data should become a high level, namely DOT=a high level and DOB=a low level, since operation of this output circuit is similar to that of the output circuit shown in FIG. 6, which is previously conceivable by the Inventors, explanations thereof are omitted.

Figure 16:
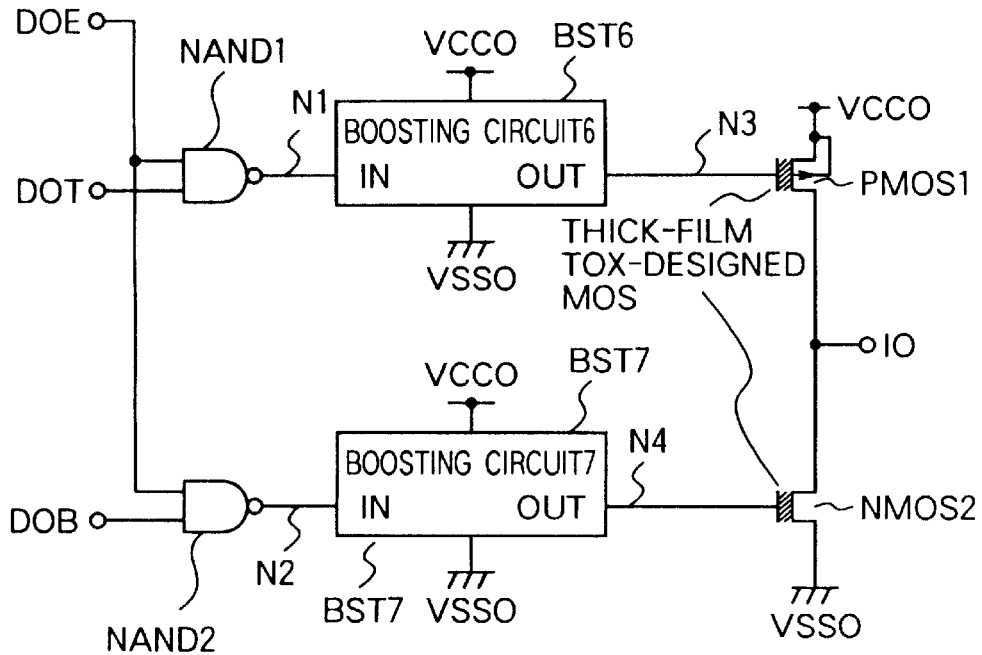
FIG. 16 shows a circuit diagram of an output circuit employed in a semiconductor integrated circuit, according to a fourth embodiment of the present invention.
Figure 18:
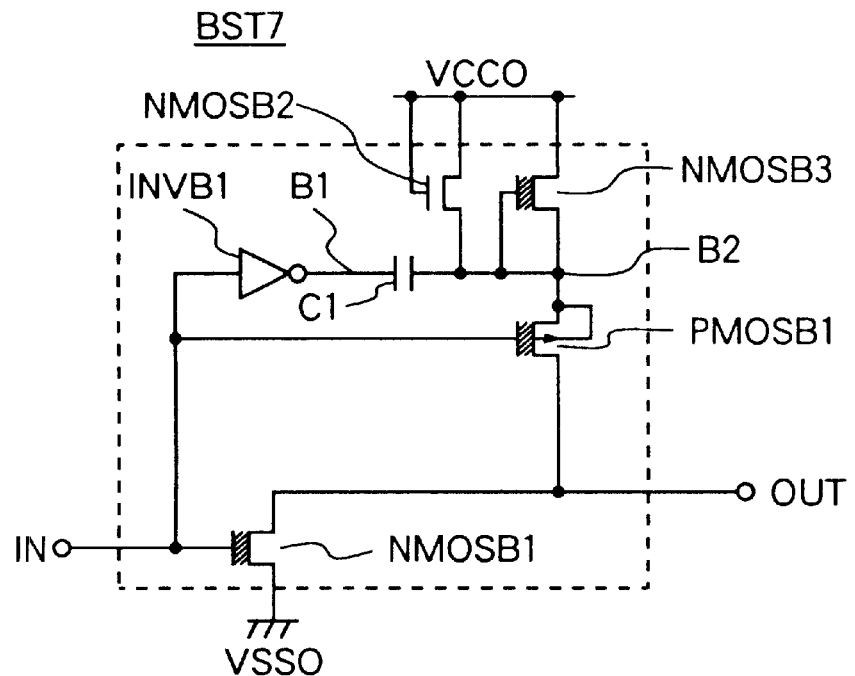
FIG. 18 is a circuit diagram for indicating a concrete circuit of the boosting circuit BST7 employed in the output circuit of FIG. 16.
Figure 19:
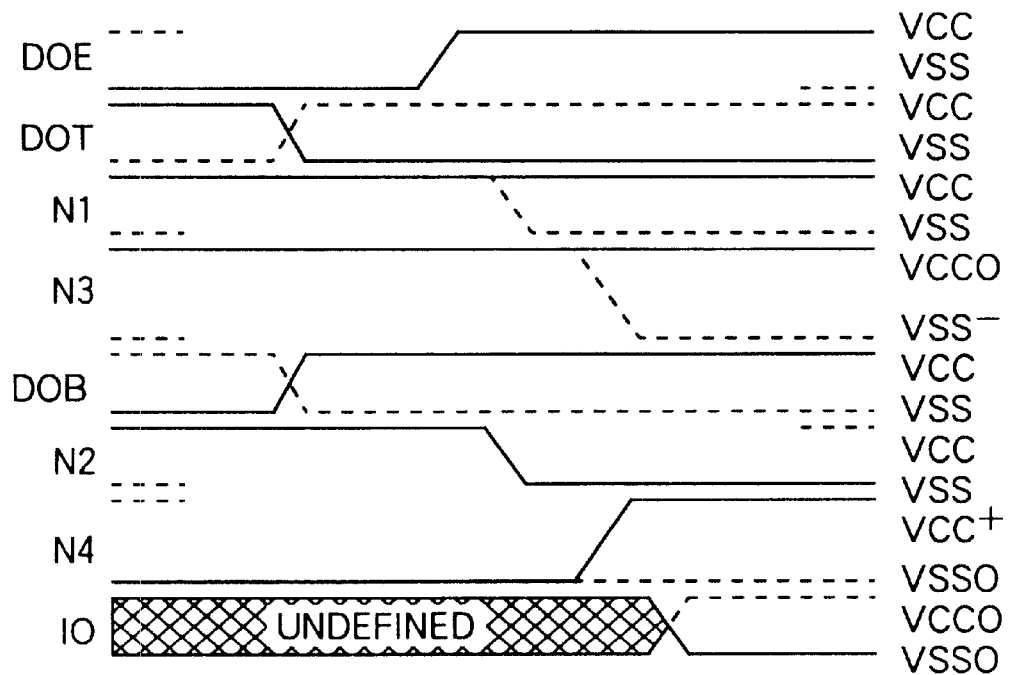
FIG. 19 indicates an operation waveform diagram of the output circuit shown in FIG. 16.

FIG. 16 shows a circuit arrangement of an output circuit according to a fourth embodiment of the present invention. FIG. 13 is a circuit diagram for representing a concrete circuit of a boosting circuit 6 (BST6) indicated in a black box of FIG. 16. FIG. 18 is a circuit diagram for indicating a concrete circuit of another boosting circuit 7 (BST7). FIG. 19 shows an operation waveform diagram of the output circuit according to the fourth embodiment. It should also be noted that the same names of FIG. 6 will be employed as those for denoting the same functional elements shown in the circuit diagram of FIG. 16.

A structural feature of the output circuit of FIG. 16 according to the fourth embodiment is such that a boosting circuit which has not so far used in the CMOS type output circuits is newly employed so as to produce a signal which should be supplied to gates of high-level/low-level outputting MOS transistors. Furthermore, high voltage withstanding MOS transistors are newly employed as a high-level outputting MOS transistor, a low-level outputting MOS transistor, and a certain number of MOS transistors used in a boosting circuit, to which a relatively higher voltage is applied, as compared with other circuits. In connection with this featured structure, the high-level outputting nMOS NMOS2 as shown in FIG. 6 is substituted by a pMOS, the boosting circuit 1 (BST1) is replaced by another boosting circuit 6 (BST6), and furthermore a further boosting circuit 7 (BST7) is additionally employed in the output circuit of the fourth embodiment shown in FIG. 16.

The boosting circuit 6 (BST6) is such a boosting circuit for decreasing the level of the node N3 to a low level lower than, or equal to the VSSO level when the level of the node N1 becomes a low level, namely the VSS level. This boosting circuit is realized as, for instance, a circuit indicated in FIG. 17. As a consequence, lowering of the circuit operating speed which is caused by lowering of the VCCO level can be avoided.

The boosting circuit 7 (BST7) is such a boosting circuit for increasing the level of the node N4 to a high level higher than, or equal to the VCCO level when the level of the node N2 becomes a low level, namely the VSS level. This boosting circuit is realized as, for instance, a circuit indicated in FIG. 18. As a consequence, lowering of the circuit operating speed which is caused by floating of the VSSO level can be avoided.

Figure 17:
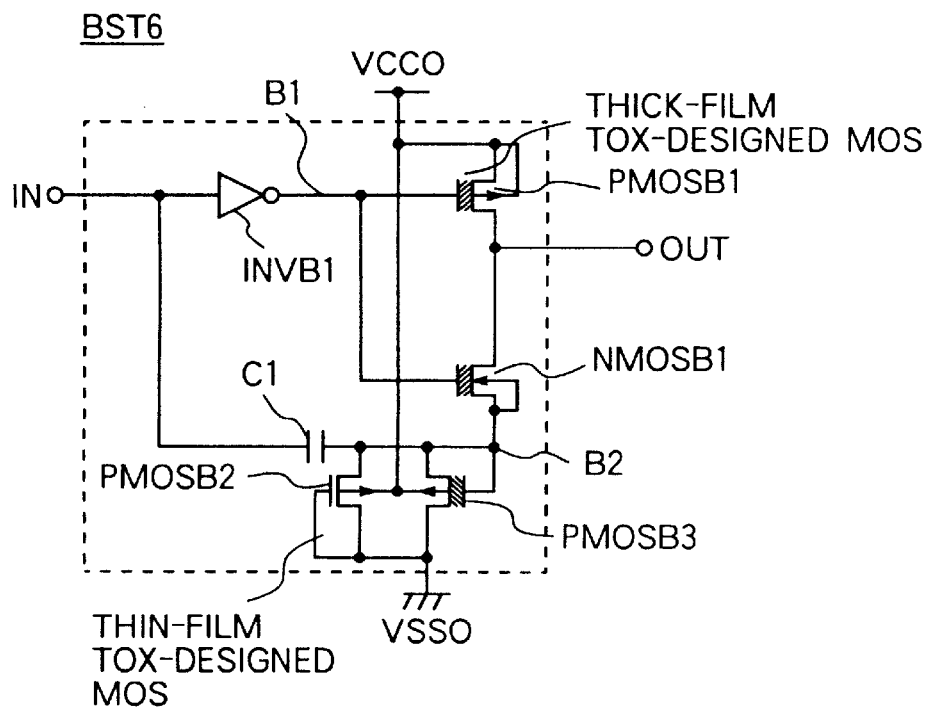
FIG. 17 is a circuit diagram for representing a concrete circuit of the boosting circuit BST6 employed in the output circuit of FIG. 16.

Similar to the above-explained third embodiment, the MOS transistors employed in the fourth embodiment shown in FIG. 16 to FIG. 18, namely PMOS1, and NMOS2; PMOSB1, NMOSB1 and PMOSB3 employed in the boosting circuit 6 (BST6); NMOSB3, PMOSB1, and NMOSB1 employed in the boosting circuit 7 (BST7) are constituted by the thick-film TOX designed MOS transistors, i.e., the MOS transistors designed as the high-voltage withstanding specification. It should also be noted that the high-voltage withstanding designed MOS transistor may be applied not only to the output circuit, but also such a circuit portion to which a relatively high VCCO level is applied.

Next, a description will now be made of operations of this output circuit according to the fourth embodiment.

When the output data should become a low level, namely DOT=a low level and DOB=a high level, the output circuit of FIG. 16 is operated in such a manner that signals varied as indicated by solid lines of FIG. 19 are produced.

In other words, first, when the output data DOT and DOB derived from an internal circuit (not shown) (namely, input data to output circuit) are determined as a low level and a high level, respectively, and also the control signal DOE becomes a high level, the level of the internal node N2 becomes a low level in response to these level changes. Also, the level of the node N4 to which the gate of the NMOS2 is coupled is increased by the boosting circuit 7 (BST7) to a high level higher than, or equal to the VCCO level. As a consequence, even when the potential of the VSSO level is floated, lowering of the circuit operating speed can be suppressed.

When the output data should become a high level, namely DOT=a high level and DOB=a low level, the output circuit of FIG. 16 is operated in such a manner that signals varied as indicated by dotted lines of FIG. 19 are produced.

In other words, first, when the output data DOT and DOB derived from an internal circuit (not shown) (namely, input data to output circuit) are determined as a low level and a high level, respectively, and also the control signal DOE becomes a high level, the level of the internal node N1 becomes a low level in response to these level changes. Also, the level of the node N3 to which the gate of the PMOS1 is coupled is also decreased by the boosting circuit 6 (BST6) to a low level lower than, or equal to the VSSO level. As a consequence, even when the potential of the VCCO level is dropped, lowering of the circuit operating speed can be suppressed.

Figure 20:
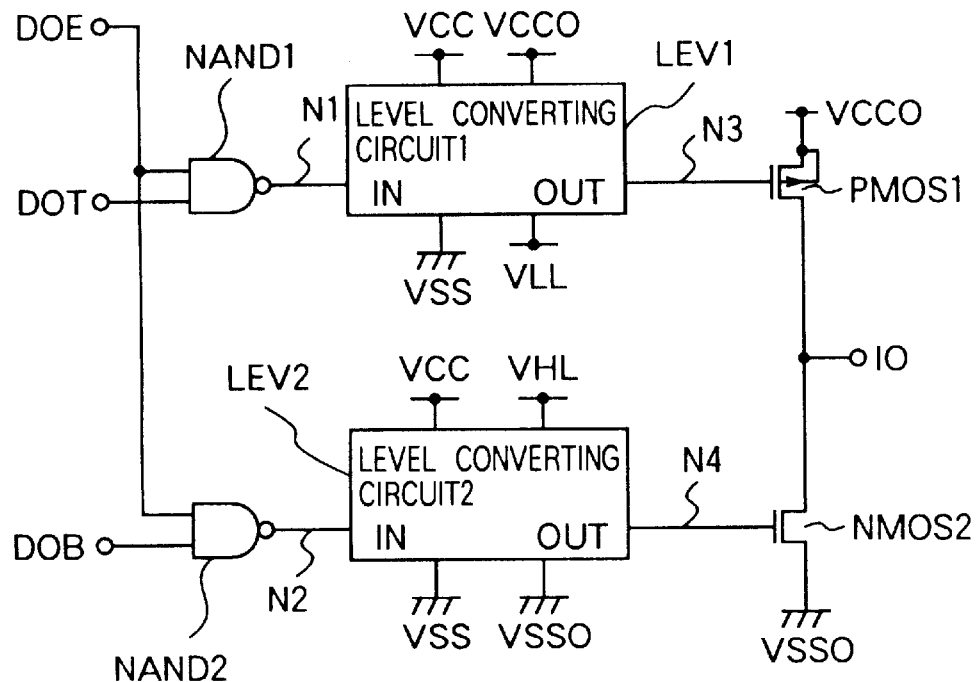
FIG. 20 indicates a circuit diagram of an output circuit employed in a semiconductor integrated circuit, according to a fifth embodiment of the present invention.
Figure 21:
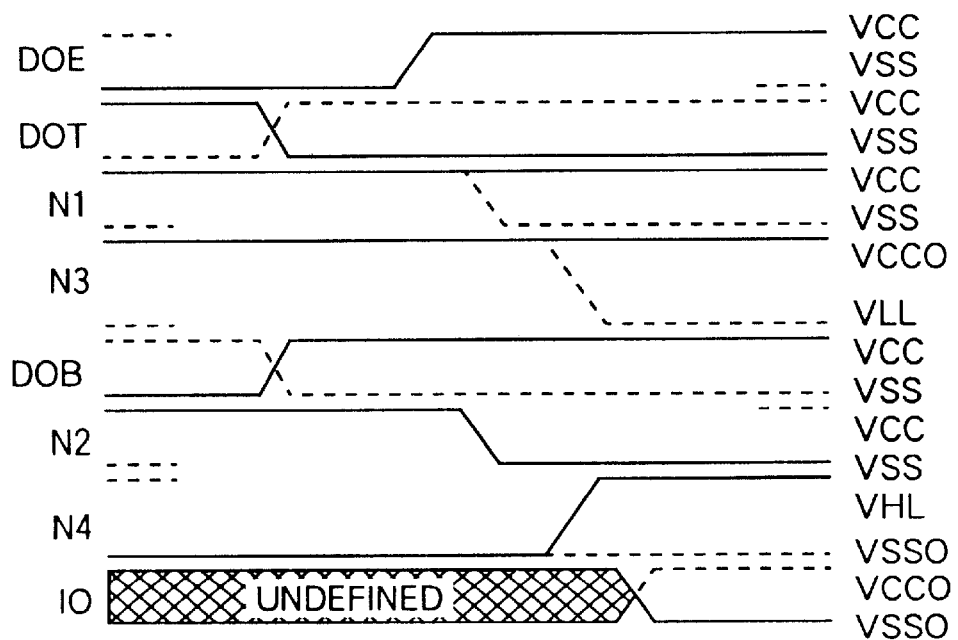
FIG. 21 represents an operation waveform diagram of the output circuit shown in FIG. 20.

FIG. 20 shows a circuit diagram of an output circuit employed in a semiconductor integrated circuit (not shown in detail), according to a fifth embodiment of the present invention. FIG. 21 represents a control signal for this output circuit of FIG. 20, and an operation waveform thereof. It should be noted that the same names shown in the above-described output circuit of FIG. 6 are employed as those for denoting the same circuit functions of FIG. 20.

The circuit arrangement of this output circuit shown in FIG. 20 is featured by that a level converting circuit LEVl is employed which has not so far employed in the previous CMOS type output circuit. This level converting circuit LEV1 level-converts an amplitude (VCC–VSS) of a signal inside a chip into a large amplitude (VCCO–VLL), and produces a signal which should be applied to a gate of a high-level outputting MOS transistor. Furthermore, another level converting circuit LEV2 level-converts the amplitude (VCC–VSS) of the signal inside the chip into a large amplitude (VHL–VSSO), and also produces a signal which should be applied to a gate of a low-level outputting MOS transistor.

It should be understood that symbol "VLL" indicates a voltage of a voltage source, which is generated inside the chip, or outside the chip, and owns such a level lower than, or equal to VSS and VSSO levels. Also, symbol "VHL" denotes a voltage of a voltage source, which is similarly generated inside the chip, or outside the chip, and owns such a level different from VLL, but higher than or equal to either VCC or VCCO.

The level converting circuit LEV1 converts a low level of a drive signal (namely, signal for node N3) supplied to a gate of a PMOS1, namely a level of a drive signal (N3) which should bring the PMOS1 into an ON state, into a level increased lower than, or equal to VSS by VLL, so that this PMOS1 may be sufficiently brought into the ON state. Since the source of this PMOS1 is set to the VCCO level and the gate thereof is set to the level of the node N3, an effective level of the drive signal applied between these gate and source becomes (VCCO)–(N3 level). This implies that the effective drive signal level of the PMOS1 is varied in response to the variation of VCCO. Therefore, in order to sufficiently drive the PMOS1 irrelevant to the variation in the VCCO levels, the VLL level may be preferably made with having a level which is further lowered rather than such a level as the low-leveled VSS level of the node N3. As apparent, the degree of increasing of the low level at the node N3 may depend on the VLL level. As a consequence, in order that the operating speed of the circuit is made higher than, or equal to a preselected operating speed irrelevant to the variation in the VCC levels and the variation in the VCCO levels, the level of VLL may be preferably selected to be such a value which is shifted along a negative direction in response to either the variation in the VCC levels or the variation in the VCCO levels.

Although a detailed circuit arrangement of this level converting circuit LEV1 is not shown, this level converting circuit LEV1 may be arranged from such a modification circuit of the boosting circuit BST6 shown in FIG. 17. For example, this level converting circuit LEV1 may be formed by modifying the boosting circuit of FIG. 17 as follows: In the circuit of FIG. 17, the capacitor C1, and the MOS transistors PMOSB2, PMOSB3 are omitted, and the voltage VLL is applied to the node B2. A first PMOS transistor is additionally provided, the source electrode of which is coupled to the node B1 equal to an output of an inverter circuit INVB1 having a CMOS structure, and the drain electrode of which is coupled to the gate electrode of the transistor NMOSB1, and the gate electrode of which is coupled to the VSSO voltage. Furthermore, a first nMOS transistor is additionally provided, the source electrode of which is coupled to the node B2, the gate electrode of which is coupled to an output terminal OUT, and the drain electrode of which is coupled to both the gate electrode of the above-described NMOSB1 and the drain electrode of the additionally employed first PMOS transistor. With this modification, a signal having a low level of the VLL level can be outputted from the output terminal OUT shown in FIG. 17.

In the above-described modification circuit of FIG. 17, the additionally employed first PMOS transistor will constitute a so-called "cut MOS transistor". When the output from the inverter circuit INVB1 becomes such a low level as the VSSO level, this cut MOS transistor is automatically brought into an OFF state in response to this low level, and the level of which can be changed into the negative potential level at the gate electrode of the transistor NMOSB1.

The additionally provided first nMOS transistor may constitute an MOS transistor having a forward feedback function. When the NMOSB1 transistor is brought into an OFF state, this first nMOS transistor drives the gate potential of the NMOSB1 transistor to the VLL level at the node B2.

Both the additionally provided first PMOS transistor and the additionally provided first NMOS transistor may constitute one sort of a level shift circuit capable of shifting the low level of the node B1, namely VSSO level to the VLL level by combining these transistors with each other in a proper manner.

In this case, in the modified circuit arrangement of FIG. 17, the inverter circuit INVB1 is capable of performing a better CMOS circuit operation with respect to an input signal having a VCC amplitude level even if a level amplitude of an input signal applied to the input terminal IN thereof corresponds to a relatively low amplitude of the VCC level, when the operating power source voltage of this inverter circuit INVB1 is equal to the VCC level. Under such a case, the inverter circuit INVB1 outputs the output signal having the VCC amplitude level to the node B1, since the operating power source voltage thereof is equal to the VCC level. In this case, if a difference voltage between VCCO level applied to the source electrode of the transistor PMOSB1 and the high level (VCC) of the signal at the node B1 in FIG. 17 is lower than the threshold voltage of the transistor PMOSB1, the transistor PMOSB1 can be turned ON/OFF by using also the signal having the VCC amplitude level appearing at the node B1.

When the potential difference between VCCO and VCC is higher than the threshold value voltage of the transistor PMOSB1, the inverter circuit INVB1 of FIG. 17 may be modified by the CMOS-structural level converting circuit known in the technical field. This known level converting circuit contains one pair of pMOS transistors, the gate and drain electrodes of which are cross-coupled with each other and the source electrodes of which are set to voltage levels to be converted; and further one pair of NMOS transistors, the gate electrodes of which are driven in the complementary mode in response to complementary input signals having the VCC amplitude levels, and which are provided between the respective drain electrodes of one-paired pMOS transistors and VSSO.

The level converting circuit LEV1 converts a high level of a drive signal (namely, signal for node N4) supplied to a gate of an NMOS2, namely a level of a drive signal (N4) which should bring the NMOS2 into an ON state, into a level increased higher than, or equal to VCC, or VCCO by VHL, so that this NMOS2 may be sufficiently brought into the ON state. An effective drive signal level applied between the gate electrode of the NMOS2 and the source thereof is apparently decreased, since the VSS potential is floated. As a consequence, in order that the operating speed of the circuit is made higher than, or equal to a preselected operating speed irrelevant to the variation in the VSS levels and the variation in the VSSO levels, the level of VHL may be preferably selected to be such a value which is shifted along a positive direction by a level corresponding to either the potential floating of VSS or VSSO with respect to either the VCC level or the VCCO level.

Although a detailed circuit arrangement of the level converting circuit LEV2 is not shown, this level converting circuit LEV2 may be arranged by using a level shift circuit with employment of a cut MOS transistor and a forward feedback MOS transistor. For instance, the inverter circuit INVB1, the capacitor C1, and the transistors NMOSB2 and NMOSB3 are removed from the boosting circuit indicated in FIG. 18. Instead, the following modifications are made in this boosting circuit of FIG. 18. That is, VHL level is applied to the node B2; a second nMOS transistor is additionally provided, the source-to-drain path of which is formed between the input terminal IN and the gate electrode of the transistor PMOSB1, and also the gate electrode of which is coupled to either VCC or VCCO; and a second pMOS transistor is additionally provided, the source-to-drain path of which is formed between the node B2 and the gate electrode of the transistor PMOSB1, and also the gate electrode of which is coupled to the output terminal OUT.

The level converting circuit LEV2 merely produces an output having one polarity, which is completely different from the first-mentioned level converting circuit LEV1 for producing outputs having both a positive level and a negative level. Accordingly, the circuit arrangement of this level converting circuit LEV2 can be made relatively simpler.

When both VLL and VHL are produced by another common circuit such as an exclusive circuit within a chip, or a common circuit employed outside the chip, the voltage values may be highly precisely determined, as compared with such a case that both VLL and VHL are produced by using the dynamic operation caused by the charge pump action executed in side the output circuit. Also, the drive voltages can be quickly applied to the nodes N3 and N4.

Next, a description will now be made of operations of this output circuit according to the fifth embodiment.

When the output data should become a low level, namely, the input signals DOT=a low level, and DOB=a high level, the output circuit of FIG. 20 is operated in such a manner that signals varied as indicated by solid lines of FIG. 21 are produced.

In other words, first, when the output data DOT and DOB are determined as a low level and a high level, respectively, and also the control signal DOE becomes a high level, the level of the internal node N2 becomes a low level in response to these level changes. Also, the level of the node N4 to which the gate of the NMOS2 is coupled is increased by the level converting circuit LEV2 to VHL equal to a voltage higher than, or equal to the VCCO level. As a consequence, even when the potential of the VSSO level is floated, lowering of the circuit operating speed can be suppressed.

When the output data should became a high level, namely DOT=a high level and DOB=a low level, the output circuit of FIG. 20 is operated in such a manner that signals varied as indicated by dotted lines of FIG. 21 are produced.

In other words, first, when the output data DOT and DOB are determined as a low level and a high level, respectively, and also the control signal DOE becomes a high level, the level of the internal node N1 becomes a low level in response to these level changes. Also, the level of the node N3 is also decreased by the level converting circuit LEV1 to VLL equal to a voltage lower than, or equal to the VSSO level. As a consequence, even when the potential of the VCCO level is dropped, lowering of the circuit operating speed can be suppressed.

Figure 22:
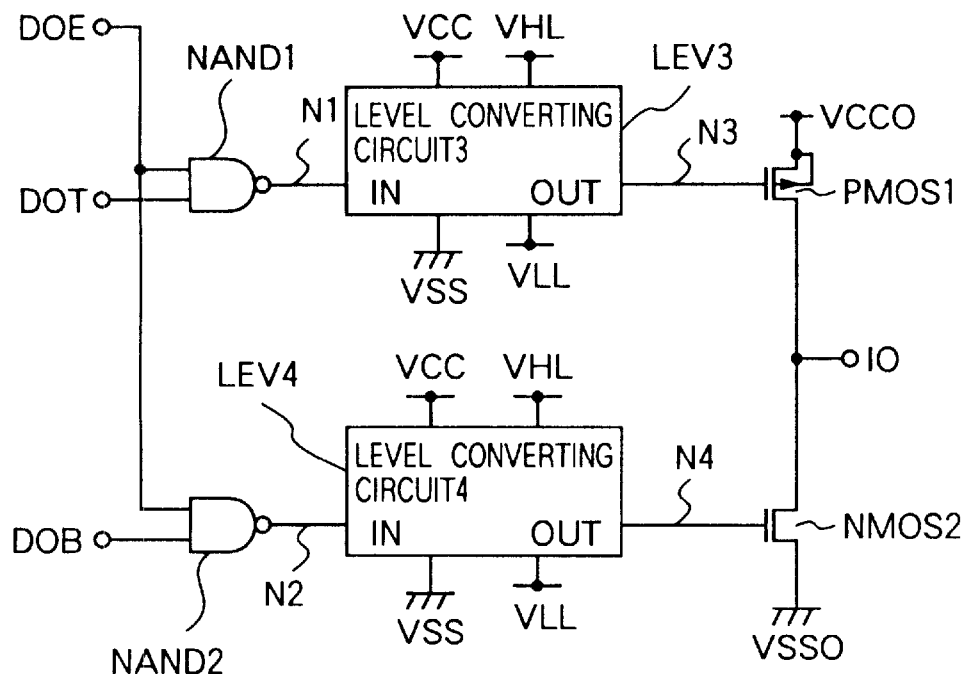
FIG. 22 indicates a circuit diagram of an output circuit employed in a semiconductor integrated circuit, according to a sixth embodiment of the present invention.
Figure 23:
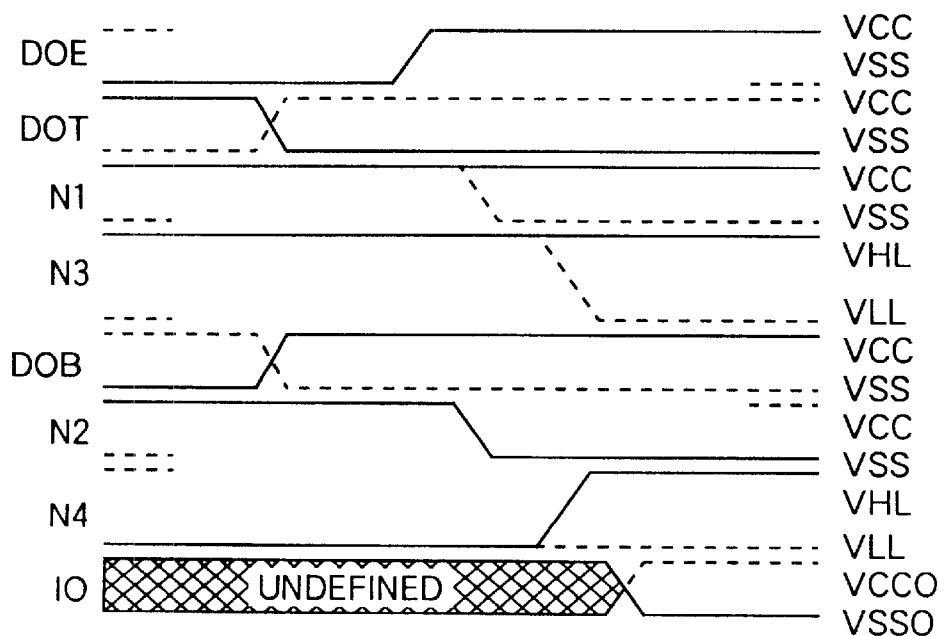
FIG. 23 represents an operation waveform diagram of the output circuit shown in FIG. 22.

FIG. 22 shows a circuit diagram of an output circuit employed in a semiconductor integrated circuit (not shown in detail), according to a sixth embodiment of the present invention. FIG. 23 represents a control signal for this output circuit of FIG. 22, and an operation waveform thereof. It should be noted that the same names shown in the above-described output circuit of FIG. 6 are employed as those for denoting the same circuit functions of FIG. 22.

The circuit arrangement of this output circuit shown in FIG. 22 is featured by that a level converting circuit LEV3 is employed which has not so far employed in the previous CMOS type output circuit. This level converting circuit LEV3 level-converts an amplitude (VCC–VSS) of a signal inside a chip into a large amplitude (VHL–VLL), and sets an output (node N3) thereof as a drive signal which should be applied to a gate of a high-level outputting MOS transistor, namely PMOS1. Furthermore, another level converting circuit LEV4 level-converts the amplitude (VCC–VSS) of the signal inside the chip into a large amplitude (VHL–VLL), and also sets an output (node N3) thereof as a drive signal which should be applied to a gate of a low-level outputting MOS transistor, namely NMOS2.

Although no concrete circuit arrangement of this level converting circuit LEV3 is shown in this specification, this level converting circuit LEV3 may be arranged by introducing the level shift technique similar to the above-explained modifications of FIG. 17 and FIG. 18 in the fifth embodiment of FIG. 20. For instance, if the circuit shown in FIG. 17 is modified in view of this level converting circuit LEV3, then a cut MOS transistor made of a pMOS transistor and a forward feedback MOS transistor made of an NMOS transistor may be additionally employed as to the transistor NMOSB1. Also, a cut MOS transistor made of an nMOS transistor and a forward feedback MOS transistor made of a pMOS transistor may be additionally employed as to the transistor PMOSB1.

In this modified circuit arrangement for the circuit of FIG. 17, the VHL voltage is applied to the source of the transistor PMOSB1 and the VLL voltage is applied to the node B2 so as to obtain a level converted signal having an amplitude from the VHL level to the VLL level.

As apparent from the foregoing descriptions, the level converting circuit LEV4 may be arranged in a similar manner to that of the above level converting circuit LEV3.

Since the level converting circuit LEV3 is employed, the potential of the node N3 can be lowered by such a potential level equal to lowering of VCCO when the high level output is produced. As a consequence, the transistor PMOS1 can be strongly conducted although the VCCO level is lowered. As a result, lowering of the operating speed can be reduced.

Since the level converting circuit LEV4 is employed, the potential of the node N4 can be increased by such a potential level equal to floating of VSSO when the low level output is produced. As a consequence, the transistor NMOS2 can be strongly conducted although the VSSO level is floated. As a result, lowering of the operating speed can be reduced.

Also, in the case that the output circuit is under non operation state instructed by the low level of the control signal DOE, since the potential of the node N3 is set to be higher than, or equal to the VCCO level, the transistor PMOS1 can be firmly brought into the OFF state irrelevant to a so-called "sub-threshold current". This "sub-threshold current" problem may occur when the transistor PMOS1 owns a relatively low threshold value voltage characteristic. Similarly, since the potential of the node N4 is set to be a potential lower than, or equal to the VSSO level, the transistor NMOS2 can also be brought into the OFF state firmly. As explained above, even when the MOS transistors having such low threshold voltages VTH are employed as the transistors PMOS1 and NMOS2, the power consumption of the output circuit can be reduced under non operation state of this output circuit such as a waiting state of a circuit system.

Next, a description will now be made of operations of this output circuit according to the sixth embodiment.

When the output data should become a low level, namely DOT=a low level and DOB=a high level, the output circuit of FIG. 22 is operated in such a manner at signals varied as indicated by solid lines of FIG. 23 are produced.

During the waiting operation, namely operations except for the data output operation, the control signal DOE is at a low level whereas the internal nodes N1 and 2 are at high levels. At this time, the node N3 connected to the gate of the transistor PMOS1 is set to the VHL level higher than, or equal to the VCC level by the level converting circuit LEV3. The node N4 connected to the gate of the transistor NMOS2 is set to the VLL level lower than, or equal to the VSSO level by the level converting circuit LEV4.

As a result, both the transistors PMOS1 and NMOS2 can be surely brought into the OFF state.

Next, when the control signal DOE becomes a high level, the internal node N2 becomes a low level at such timing that the levels of the data DOT and DOB equal to the output data of the internal circuit (not shown) have been defined at a low level and a high level as indicated in FIG. 23. In response thereto, the potential at the gate electrode (node N4) of the transistor NMOS2 is increased from the VLL level corresponding to the potential lower than, or equal to the VSSO level to the VHL level by the level converting circuit LEV4. As a consequence, even when the VSSO level is floated, lowering of the operating speed can be suppressed.

When the output data should become a high level, namely DOT=a high level, and DOB=a low level, the output circuit is operated in such a manner that signals indicated as dotted lines of FIG. 23 are produced.

In other words, first of all, when the input data DOT and DOB are determined at a high level and a low level, respectively, and thereafter the control signal DOE becomes a high level, the internal node N1 becomes a low level. In response thereto, the potential at the gate electrode (N3) of the transistor PMOS1 is decreased to the VLL level equal to such a potential lower than, or equal to the VSSO level by the level converting circuit LEV3. As a consequence, even when the VCCO potential is dropped, lowering of the operating speed can be suppressed.

Figure 24:
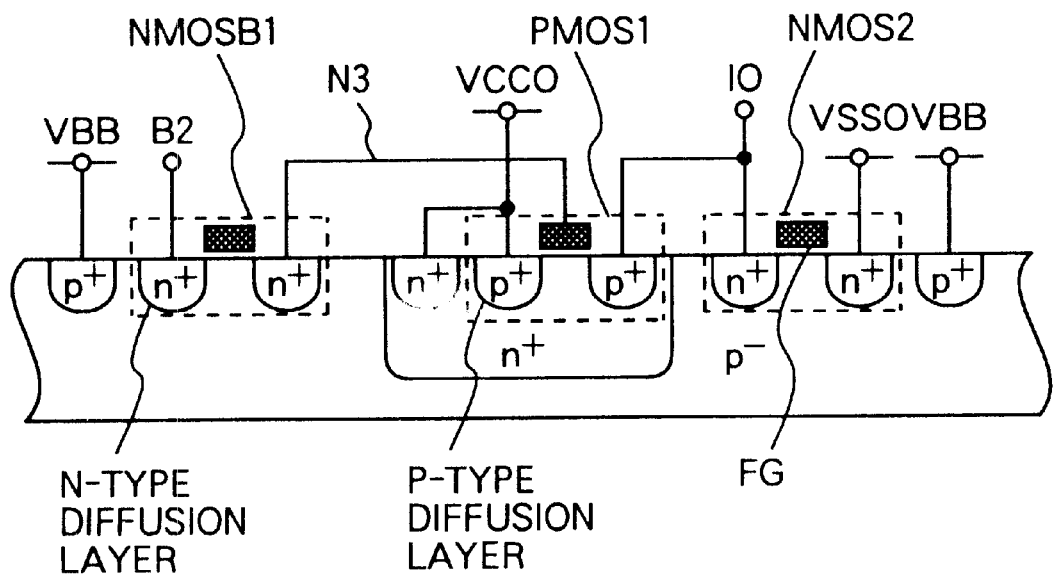
FIG. 24 is a sectional diagram for showing a CMOS semiconductor device having a double well structure.
Figure 25:
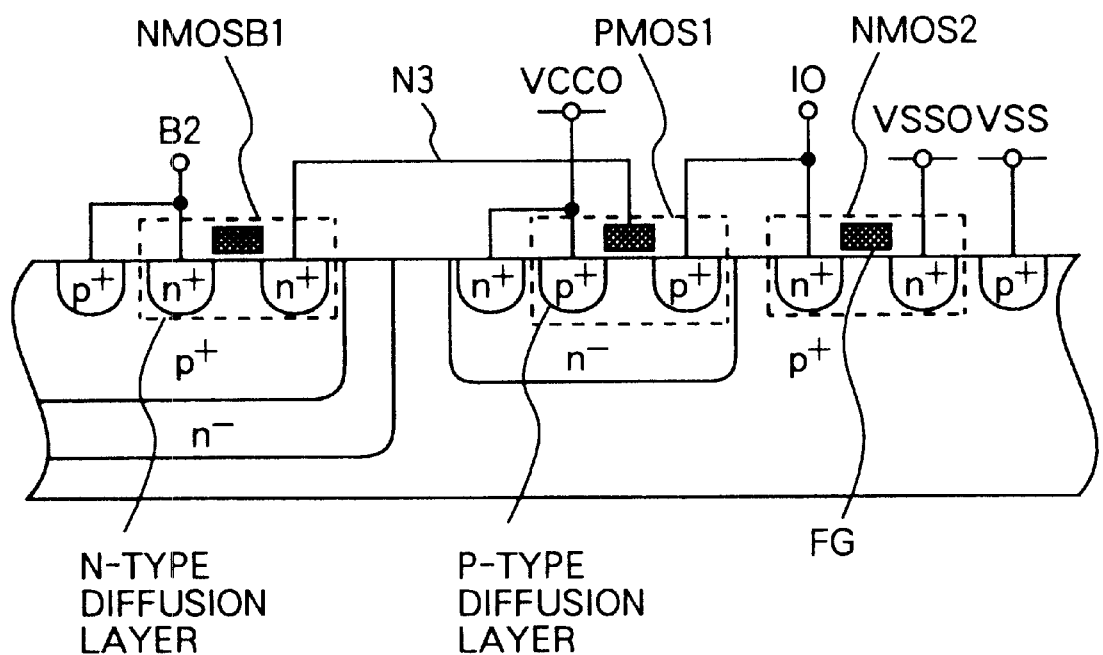
FIG. 25 is a sectional diagram for representing a CMOS semiconductor device having a triple well structure.

FIG. 24 and FIG. 25 are sectional views for rep resenting a major portion of a semiconductor chip according to a seventh embodiment of the present invention. FIG. 24 schematically represents a section of a CMOS semiconductor chip having a so-called "double well" structure, whereas FIG. 25 schematically shows a section of a CMOS semiconductor chip having a so-called "triple well" structure. It should be noted that the same reference numerals shown in the previous embodiments will be employed as those for denoting the same functional elements in FIG. 24 and FIG. 25.

In FIG. 24 and FIG. 25, symbol "n$^+$" indicates an N type diffusion layer, symbol "p$^+$" shows a P type diffusion layer, symbol "n$^-$" indicates an N type well region, symbol "p" shows a P type diffusion layer, symbol "FG" denotes a gate electrode of an MOS transistor, and symbol "VBB" shows a substrate potential to be applied to a semiconductor substrate.

In the CMOS semiconductor chip having the double well structure shown in FIG. 24, a plurality of required nMOS transistors are formed in a common P type well region "p$^-$", and the substrate potential VBB is commonly applied to these nMOS transistors. In this structure, the potentials at the substrate gates (namely, P type well region "p$^-$" of the plural nMOS transistors are made equal to each other. As a result, it is not possible to achieve such a circuit connection that the substrate gate is connected to the node B2 as in the transistor NMOSB1 of FIG. 17. Even in the CMOS semiconductor device structure having the double well structure, the substrate gate of the transistor NMOSB1 shown in FIG. 17 may be connected to the minimum potential point VBB common to the circuit, instead of connecting of the node B2ni. However, in this alternative case, since the bias voltage VBB is applied to the substrate gate of the transistor NMOSB1, the essential threshold voltage of this transistor NMOSB1 is increased. Thus, it is practical different to drive this transistor NMOSB1 in such a manner that this transistor may own a sufficiently low ON-resistance value.

In the case of the triple well structure shown in FIG. 25, a plurality of substrate gates of the NMOS transistors can be electrically separated from each other As a result, it is possible to achieve such a connection of the transistor NMOSB1 shown in FIG. 17. Since it is possible to avoid the application of the bias voltage to this substrate gate in the transistor NMOSB1, increasing of the threshold voltage due to the back bias effect can be prevented. Thus, this threshold voltage VTH can be lowered. Therefore, in the circuit of FIG. 17, the electric charge/discharge operations can be effectively performed from the node B2 to the node N3.

As previously described in the above embodiments, the delays in the operations of the output circuit caused by floating the VSSO potential can be avoided, so that the output circuit can be operated in high speeds.

What is claimed is:

1. A semiconductor device comprising an internal circuit and a first outputting circuit for outputting a signal from said internal circuit, wherein said first outputting circuit includes:

a first transistor of p-type and a second transistor of n-type which are connected in series between a first potential and a second potential which is lower than the first potential;

an output node connected to the coupling node of the first and second transistors;

a first boosting circuit for generating a third potential which is lower than the second potential and supplying the third potential to the gate of the first transistor in response to a signal from said internal circuit; and a second boosting circuit for generating a fourth potential which is higher than the first potential and supplying the fourth potential to the gate of the second transistor in response to a signal from said internal circuit, wherein the first boosting circuit includes:

a first input node;

a first output node coupled to the gate of the first transistors;

a first inverter having an input coupled to the first input node;

a third transistor of p-type having a source coupled to the first potential, a gate coupled to the output of the first inverter, and a drain coupled to the first output node;

a fourth transistor of n-type having a drain coupled to the first output node and a gate coupled to the output of the first inverter;

a first boosting capacitor having a first electrode coupled to the first input node and a second electrode coupled to the source of the fourth transistor; and a fifth transistor of p-type having a source coupled to the source of the fourth transistor, a drain coupled to the second potential, and a gate coupled to the second potential, and wherein the second boosting circuit includes:

a second input node;

a second output node coupled to the gate of the second transistors;

a second inverter having an input coupled to the second input node;

a second boosting capacitor having a third electrode coupled to the output node of the second inverter and a fourth electrode;

a sixth transistor of n-type having a drain coupled to the first potential, a gate coupled to the first potential, and a source coupled to the fourth electrode;

a seventh transistor of p-type having a source coupled to the fourth electrode, a gate coupled to the second input node, and a drain coupled to the second output rode; and an eighth transistor of n-type having a drain coupled to the second output node, a gate coupled to the second input node, and a source coupled to the second potential.

2. A semiconductor device according to claim 1, wherein the first boosting circuit further includes a first rectification circuit coupled between the source of the fourth transistor and the second potential; and wherein the second boosting circuit further includes a second rectification circuit coupled between the source of the seventh transistor and the first potential.

3. A semiconductor device according to claim 2, wherein the first rectification circuit is a ninth transistor of p-type having a source coupled to the second electrode, a gate coupled to the second electrode, and a drain coupled to the second potential;

wherein second rectification circuit is a tenth transistor of n-type having a source coupled to the fourth electrode, a gate coupled to the fourth electrode, and a drain coupled to the first potential; and wherein each of the first to tenth transistors is a MOS transistor and the thickness of gate insulator film of the first, second, fourth, fifth, seventh, eighth, ninth, and tenth transistors are thicker than that of the third and sixth transistors.

4. A semiconductor device according to claim 1, wherein each of the first to eighth transistors is a MOS transistor and the thickness of gate insulator film of the first, second, fourth, fifth, seventh, and eighth transistors are thicker than that of the third and sixth transistors.

5. A semiconductor device according to claim 1, wherein each of the first to eighth transistors is a MOS transistor and the thickness of a gate insulator film of the first, second, fourth, fifth, seventh, and eighth transistors is greater than that of transistors used in said internal circuit.

6. A semiconductor device according to claim 1, wherein the fourth transistor is formed in a p-type semiconductor region having a triple well structure and the substrate gate of the fourth transistor is connected to the drain of the fourth transistor.

7. A semiconductor device according to claim 6, wherein the substrate gates of the third and fifth transistors are connected to the first potential.

8. A semiconductor device according to claim 1, further comprising:

a first bonding pad for receiving the first potential;

a second bonding pad for receiving the second potential;

a first power supply line connected to said first bonding pad;

a second power supply line connected to said second bonding pad; and a second outputting circuit for outputting a signal from said internal circuit, wherein said second outputting circuit has the replicated elements included in said first outputting circuit, wherein the source of the second transistor of the first outputting circuit is connected to the second power supply line at a first position and the source of the second transistor of the second outputting circuit is connected to the second power supply line at a second position, wherein the first position is closer to the second bonding pad than the second position.

9. A semiconductor device according to claim 1, further comprising:

a first bonding pad for receiving the first potential;

a second bonding pad for receiving the second potential;

a first power supply line connected to said first bonding pad;

a second power supply line connected to said second bonding pad; and a second to a sixteenth outputting circuits for outputting signals from said internal circuit, wherein each of said second to sixteenth outputting circuits has the replicated elements included in said first outputting circuit, wherein the source of the second transistor of the first to sixteenth outputting circuits are connected to the second power supply line, wherein the connected position of the first outputting circuit is the nearest to the second bonding pad and the connected position of the sixteenth outputting circuit is the most far from the second bonding pad, and wherein said semiconductor device is a dynamic random access memory having multi-bit output and said first to sixteenth outputting circuit are used for 16-bit parallel output.

* * * * *